(12) United States Patent
Seigler et al.

(10) Patent No.: US 9,543,945 B2
(45) Date of Patent: Jan. 10, 2017

(54) FIRE SENTRY

(71) Applicants: Benjamin Henry Seigler, Sevierville, TN (US); Tom Columbano, Clewiston, FL (US)

(72) Inventors: Benjamin Henry Seigler, Sevierville, TN (US); Tom Columbano, Clewiston, FL (US)

(73) Assignees: Benjamin H. Seigler, Sevierville, TN (US); Tom Columbano, Miami, FL (US)

( * ) Notice: Subject to any disclaimer, the term of this patent is extended or adjusted under 35 U.S.C. 154(b) by 0 days.

(21) Appl. No.: 13/999,577

(22) Filed: Mar. 11, 2014

(65) Prior Publication Data

US 2014/0252880 A1    Sep. 11, 2014

Related U.S. Application Data

(63) Continuation-in-part of application No. 13/164,299, filed on Jun. 20, 2011, now abandoned.

(51) Int. Cl.
| | |
|---|---|
| *G08B 17/10* | (2006.01) |
| *H03K 17/94* | (2006.01) |
| *F24C 7/08* | (2006.01) |
| *F24C 3/12* | (2006.01) |

(52) U.S. Cl.
CPC ............... *H03K 17/94* (2013.01); *F24C 3/126* (2013.01); *F24C 7/08* (2013.01); *Y10T 307/766* (2015.04)

(58) Field of Classification Search
CPC ............... F24C 3/12; F24C 7/08; F24C 3/126; G08B 17/10; Y10T 137/1915
See application file for complete search history.

(56) References Cited

U.S. PATENT DOCUMENTS

| | | | | |
|---|---|---|---|---|
| 5,939,992 | A | * | 8/1999 | Devries et al. ............... 340/657 |
| 2006/0170542 | A1 | * | 8/2006 | Schoor .......................... 340/506 |
| 2006/0232431 | A1 | * | 10/2006 | Shirlee .......................... 340/628 |

* cited by examiner

*Primary Examiner* — Hongmin Fan

(57) ABSTRACT

System, method, and apparatus for automatically disabling an appliance to prevent accidental fires. A shut-off system is coupled to a smoke detector. When the smoke detector alarm is activated a signal is sent to the shut off system coupled to a cooking appliance. The shut off system includes a timer and an override mechanism. If the override mechanism is triggered prior to the timer expiring, then the shut off system does not activate. If the override mechanism is not triggered prior to the timer expiring then the shut off system activates and decouples the appliance from its power supply.

7 Claims, 2 Drawing Sheets

Exemplary System Component Configuration 100

Exemplary Operation of System 200

FIRE SENTRY

CLAIM OF PRIORITY

This application is a continuation in part of the application filed by inventor Benjamin Seigler on Jun. 20, 2011. The applicants claim for this application the priority date established by patent application Ser. No. 13/164,299, filed on Jun. 20, 2011.

FIELD OF THE INVENTION

Certain embodiments of the invention relate to automated safety capabilities for appliances. More specifically, certain embodiments of the invention relates to safety devices for disabling appliances in response to the activation of a smoke alarm.

BACKGROUND OF THE INVENTION

Most residential fires originate in the kitchen as a result of negligence during cooking. Ovens and stove-top burners are often left unattended. Gas or electric stoves and ovens are found in most homes and apartments, and also in some office buildings. Many of these stoves and ovens have built-in timers that may be set by a user to give an audible alarm after a set time interval has elapsed. Such alarms remind the user to check what they are cooking on the stove or in the oven and to turn off the power to the oven or cook-top. However, a user may simply forget that the stove or oven is in use. This problem is compounded if the user has an illness such as Alzheimer's disease or other mental impairment that affects memory. Also, if a user does not hear the timer's audible alarm, then the oven or cooking surface remains on and the food may become overcooked or burnt, and a fire may start. A user may not hear the timer alarm because the user may be in a different room in the house, or because the user may be hearing-impaired, for example. Still other fires have been caused by falling asleep while cooking. In addition, unforeseen events such as electrical shorts, earthquakes, and product failures can result in accidental fires.

Additional objects of the present invention will become apparent from reading of the summary and detailed description set forth below.

SUMMARY OF THE INVENTION

The present invention provides a novel system for removing the supply of electric power or flammable gas from cooking appliances upon the detection of smoke. The invention incorporates several advantageous features not previously available in similar art.

First, the present invention includes an override mechanism to allow for cooking food to cause smoke without immediately triggering the shut-off switch of the inventive system.

Further, the present invention can be engineered to be portable and easy to install. Importantly, the size of the current invention, and hence its portability, can be customized to meet the specifications of a particular application. This capability greatly expands the realm of its uses.

In accordance with the broad aspect of the invention a sensor, remote from a cooking appliance to be deactivated, is conditioned to respond to one or more predetermined environmental conditions. Upon sensing the pre-determined environmental conditions the sensor transmits an activating signal in response to the triggering environmental conditions. A receiver is coupled with a deactivation device operative to decouple the appliance's power supply from the cooking appliance.

In accordance with a preferred embodiment, the invention comprises a remotely located smoke detector in responsive communication with a transmitter for broadcasting an alarm signal when smoke is detected by the smoke detector, and a receiver, proximate to a deactivation device, adapted to deactivate at least one cooking appliance in response to the alarm signal. Thus, when smoke is remotely detected, the deactivation device would deactivate for example, a gas stove by closing a gas shut off valve that could feed the fire. Alternatively, for example, the deactivation device would open an electrical circuit to disable heat-producing cooking devices connected to the system which could be possible sources of the fire.

The preferred embodiment further comprises a timer physically associated with the deactivation device, said timer operatively configured to delay operation of the deactivation device for a pre-set interval of time after the deactivation device receives an alarm signal from the transmitter associated with the smoke detector. In this embodiment the operation of the deactivation device is delayed until the expiration of the pre-set interval of time. Said timer also includes an on-off mechanism which, when manually triggered before the expiration of the pre-set time interval, halts said timer thus effectively overriding operation of the deactivation device. Because cooks often prepare food in a manner that intentionally leads to sufficient smoke to set off a smoke detector, this timer/override feature allows an operator to temporarily override the cooking appliance deactivation system. While at the same time, if the cooking appliance has been left on while unattended, the override feature will not be manually triggered and the deactivation device will decouple the cooking appliance from its power source at the end of the timer's pre-set time interval.

In one embodiment of the present invention the deactivation device is an electrical interface between a permanent electrical power source and an electric cooking appliance and is adapted to interrupt electric power from the power source to the appliance when a specified environmental condition is detected. The electrical deactivation device of the present invention preferably includes a pair of input terminals, similar to the male prongs of a power supply cord plug, adapted for releasable engagement with a source of electrical power, such as a conventional wall socket providing alternating current power. The electrical deactivation device further includes at least one pair of output terminals, similar to the female receptacles of a wall socket, adapted for releasable engagement with input terminals associated with the appliance, such as a conventional power cord plug. In the preferred embodiment, one set of input (male) terminals are provided per set of output (female) terminals.

The electrical deactivation system of the present invention includes a smoke detector configured to send a signal to the timer associated with the electrical deactivation device upon detection of smoke. The circuit of the timer is operative to delay operation of the electrical deactivation device until passage of a pre-set time interval. Upon expiration of the pre-set time interval, if the manual override mechanism has not been triggered, the timer is operative to trigger the electrical deactivation device, thereby interrupting electrical power to the output terminal of the electrical deactivation device, thereby decoupling the cooking appliance from its electrical power source.

In the preferred embodiment of the present invention, a timer alarm is provided in the deactivation device that is operative to indicate when the deactivation device has received an alarm signal from the smoke detector. The timer alarm may include a visual indicator and/or an audio indicator. Said timer alarm begins simultaneously with countdown of the timer which is included within the circuit of the deactivation device. In this embodiment the timer alarm is deactivated if the manual override mechanism is triggered.

Another embodiment of the present invention includes a mechanism for automatically shutting off flow of flammable gas to a cooking appliance. Automatically shutting off flow of gas may be accomplished by automatically closing a gas flow path to the cooking appliance in response to the alarm signal transmitted from a remotely located smoke detector to the deactivation device, as described herein. Said closing of gas flow path may be accomplished by shifting a two-stage in-line gas valve from a flow to a non-flow position. This embodiment may include an electrical circuit and electrical motor operatively associated with the gas valve for closing the gas valve upon expiration of the countdown by the first timer. Said electrical circuit and electric motor may require a power source that is otherwise independent from the system of the instant invention.

Beneficially, the components of the present invention can be configured to be self contained. Therefore, the present invention may be installed into existing buildings without any need for rewiring. This may be especially useful in rental properties where a person may not be allowed to modify the electrical systems. In addition, the components are portable, and may be installed in a dwelling that will only be occupied for a short time, then removed and taken to a new location. This would be difficult or impossible to do with hard-wired systems. All of the components of the preferred embodiment of the instant invention weigh less than five pounds and consist of less than one cubic liter of volume.

Also, the components of a preferred embodiment of the instant invention are configured to allow for installation with no tools in less than one minute. An attachment device comprising hook and loop adhesive is bonded to the bottom of the smoke detector with the other half of the hook and loop adhesives bonded to a surface above the cooking appliance. The deactivation device, with timer and override mechanism, is inserted into the electrical outlet and the male end of the cooking appliance power cord is inserted into the output side of the deactivation device.

These and other advantages of the invention are further described in the detailed description.

BRIEF DESCRIPTION OF THE DRAWINGS

The accompanying drawings illustrate exemplary embodiments of the present invention.

DETAILED DESCRIPTION OF THE DRAWINGS

The present invention provides a novel system for removing the supply of electric power or flammable gas from cooking appliances upon the detection of smoke, which is described more fully hereinafter. This invention may be embodied in many different forms and should not be construed as limited to the specific embodiments described herein.

Figure 1:
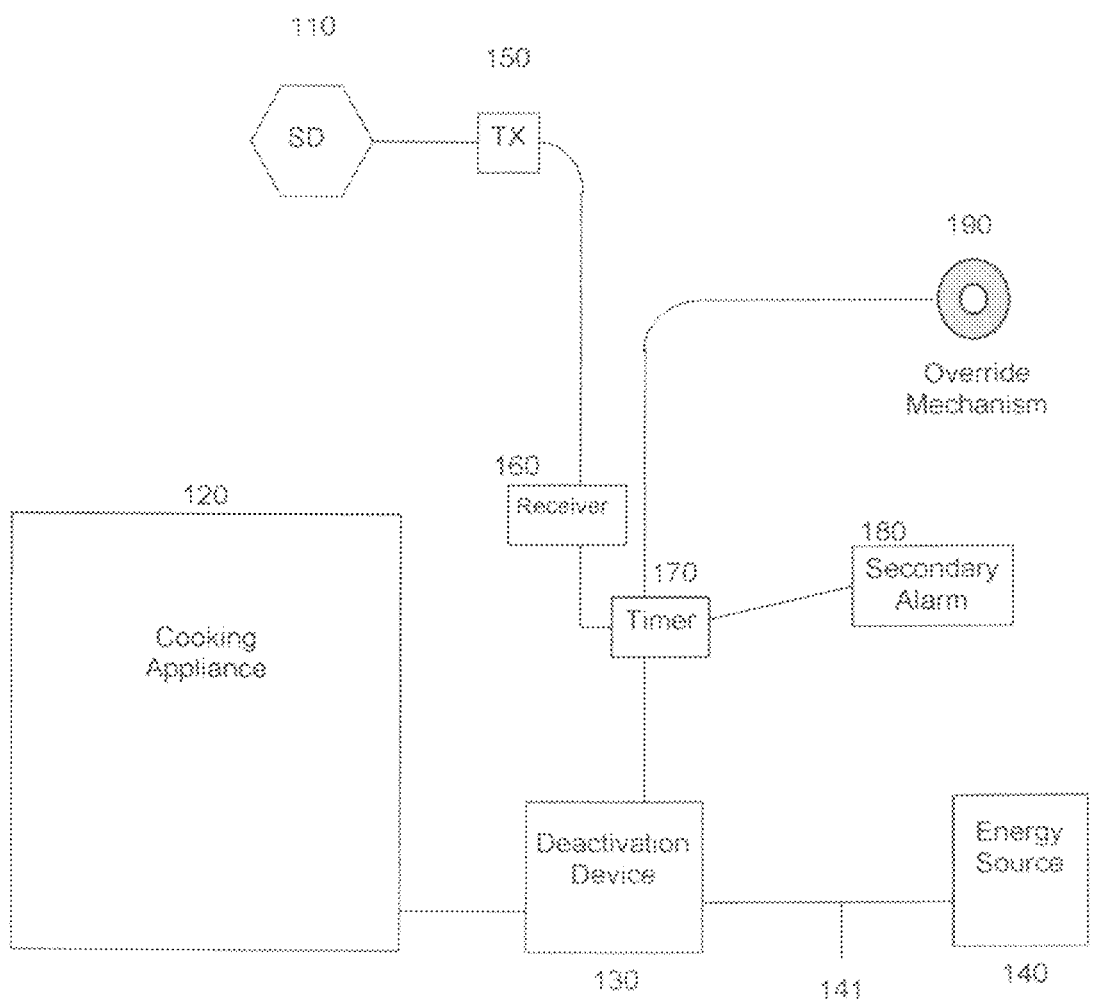
FIG. 1 is a functional block diagram disclosing the configuration of components of a preferred embodiment in relation to each other component.

Referring now to the drawings, FIG. 1 illustrates a functional block diagram of an embodiment of a system 100 for disabling a cooking appliance in response to an alarm from a smoke detector. The system 100 includes a smoke detector 110 and a cooking appliance 120. The appliance 120 may be, for example, a gas stove, an electric stove, a gas oven, an electric oven, a microwave oven, an electric skillet, a hot plate, or a combination thereof. Other types of appliances are possible as well.

The system 100 also includes a deactivation device 130. The deactivation device 130 is operatively connected to the smoke detector 110 and the appliance 120. The deactivation device 130 is connected between an energy source 140 (e.g., a combustible gas source or an electric source) and the appliance 120 in, for example, a main line 141 leading from the energy source 140 to the appliance 120. During normal operation, the deactivation device 130 allows energy (e.g., natural gas or electricity) to pass from the energy source 140 to the appliance 120.

When the smoke detector 110 detects smoke, a transmitter 150 operatively associated with the smoke detector 110 generates a signal which is received by a receiver 160 which is operatively associated with the deactivation device 130.

When the receiver 160 receives the signal from the transmitter 150 a timer 170, which is operatively associated with the receiver 160 and the deactivation device 130, begins counting down a pre-set interval of time and simultaneously triggers a timer alarm 180. The timer alarm 180 may include a visual indicator and/or an audio indicator.

An override mechanism 190 operatively associated with the timer 170 may be manually triggered at any time during the timer 170 countdown. If the override mechanism 190 is manually triggered then the timer 170 halts the countdown and the timer alarm ceases, indicating that the timer 170 countdown has been halted. Triggering the manual override mechanism 190 cancels operation of the system 100. When the manual override 190 is triggered the system 100 halts its functions until the manual override mechanism 190 is manually placed back into the non-override position. In an alternate embodiment the manual override mechanism 190 is operatively coupled to a secondary timer that automatically places the manual override mechanism 190 into the non-override position upon the expiration of a second pre-set time interval.

If the override mechanism 190 is not manually triggered before expiration of the timer's 170 countdown, then the deactivation device 130 effectively blocks the flow of energy from the energy source 140 to the appliance 120 in response to the signal from the transmitter 150. Therefore, if the appliance 120 is the source of the detected smoke, then disabling the appliance 120 by blocking the flow of energy to the appliance 120 may help reduce or extinguish any associated fire causing the smoke.

In accordance with various embodiments of the present invention, the signal sent from the transmitter 150 to the receiver 160 may be sent via wired means or wirelessly. The signal may be, for example, a radio frequency (RF) signal, infra red (IR), other electromagnetic frequency, a pulsed signal, or a simple voltage level.

In accordance with various embodiments of the present invention, the timer alarm 180 may include a visual signal such as a light or color shift, or an auditory signal such as an alarm tone, or a combination of visual and auditory signals. Said signals may also include flashes, variable, alternating, or steady signals.

Figure 2:
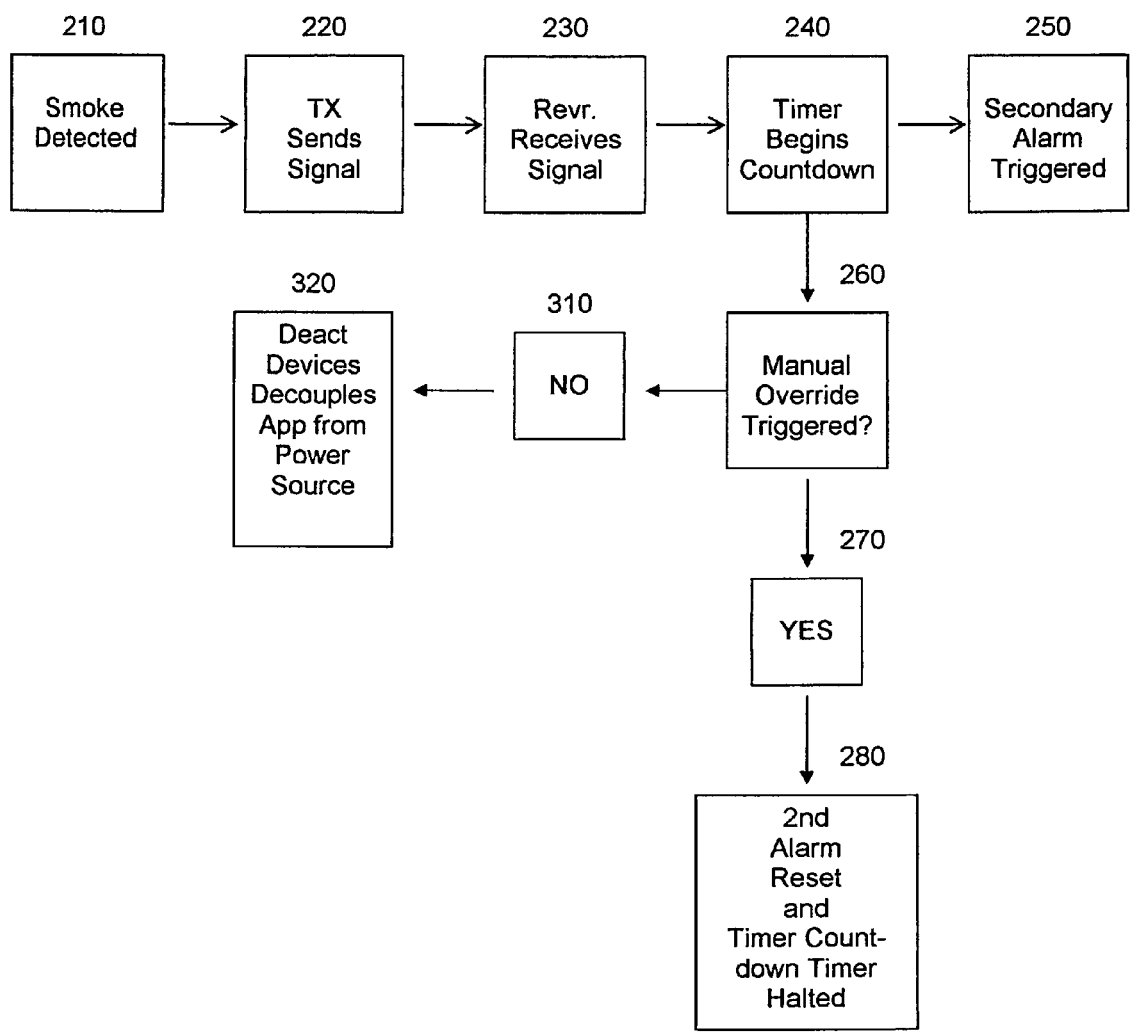
FIG. 2 is a flow chart disclosing an exemplary operation of the preferred embodiment.

FIG. 2 is a flow chart illustrating the operation of the preferred embodiment of a system 200 for disabling a cooking appliance in response to an alarm from a smoke detector. The system 200 includes detection of smoke 210 which triggers transmission of a signal 220 from a transmitter operatively associated with a smoke detector. The system also includes a receiver operatively associated with a timer. When the receiver receives the signal 230 sent from the transmitter a timer, operatively associated with the receiver, begins a countdown of a pre-set interval of time 240.

Upon beginning of the countdown 240 a timer alarm is triggered. The timer alarm may include a visual signal such as a light or color shift, or an auditory signal such as an alarm tone, or a combination of visual and auditory signals. Said signals may also include flashes, variable, alternating, or steady signals.

The system also includes a manual override mechanism operatively associated with the timer. If the manual override mechanism is triggered 270 prior to the expiration of the countdown, then the timer alarm is reset to indicate no alarm and the operation of the disabling system is cancelled and the deactivation device will not operate 280.

If the manual override mechanism is not triggered 310 prior to the expiration of the countdown, then the deactivation device decouples the cooking appliance from its power source 320.

EXAMPLES

The present invention is further described by the following non-limiting examples.

Example 1

Typical Fire Prevention

The instant invention provides a novel system for removing the supply of electric power or flammable gas from cooking appliances upon the detection of smoke. This Example describes an exemplary and typical use of said system in accordance with the present invention.

Common operation of the system described herein prevents accidental fire caused by leaving food unattended on a cooking appliance after said appliance has been turned on. For example, if food is left on a stove top that has been turned on the food will eventually begin to smoke. Smoke from the pre-burning food will activate the smoke detector. The transmitter of the present invention will, upon activation of the smoke detector, send a signal to the receiver of the present invention. A light or sound will indicate to the cook that the smoke detector has detected smoke. If the cook does not manually set the override mechanism, then the deactivation device of the present invention will decouple the stove top from the stove top's energy source. By thus turning off the stove top, the present invention will prevent the food from achieving ignition temperature.

Example 2

Cooking Onions, and Triggering the Override

Continuing the above example, if the cook is supervising the food, and intends to allow the food to partially burn as part of the cooking process, then the cook can override the system of the present invention by manually triggering the override mechanism. If the cook triggers the override mechanism, then the system of the present invention is cancelled and the timer alarm will change to indicate no alarm. In one embodiment the system of the instant invention will remain inoperative, thereby not interrupting the power supply to the cooking appliance, until the override mechanism is manually re-set to its non-override position.

Example 3

Cooking Onions, Triggering the Override and then Forgetting the Onions

In an alternative embodiment triggering the override mechanism still cancels operation of the decoupling system, but also causes a second timer to begin counting down a second pre-set time interval. In this embodiment if the override mechanism is not manually triggered again prior to the expiration of the second pre-set time interval, then the override mechanism automatically returns to its non-override position and the entire system is re-set. If this occurs and the smoke detector is still detecting smoke after the override mechanism is re-set to non-override position, then the transmitter will again send a signal to the receiver, the first timer will again begin to count down its pre-set time interval, the timer alarm will again indicate the presence of smoke, and the system will function as described above. If the manual override is not again triggered, then upon expiration of the first pre-set time interval the deactivation device will decouple the cooking appliance from its power source. However, if the override mechanism is again manually triggered, then again the first timer will be halted, the timer alarm will indicate no alarm, and the second timer will begin counting down the second pre-set time interval.

The event loop described in this example can be repeated indefinitely. Each time the system of the present invention is overridden it will re-set after a second pre-set time, and can then be manually overridden again. If at any time the override function is not manually triggered before the expiration of the first pre-set time interval, then the system will function to decouple the cooking appliance from its energy source.

A cook using this system will have the option to continue cooking simply by triggering the manual override each time the system indicates that the timer alarm has indicated the presence of smoke. If, at any time, the cook leaves the stove top unattended, and the first timer's interval expires, then the system will turn off the stove top.

Once the smoke is removed from the area sufficient for the smoke detector to stop its alarm, the current system will return to its non-alarm state. While the smoke detector is in said non-alarm state, the transmitter of the present invention will not send a signal. Therefore, whenever the smoke alarm is not detecting smoke, the system of the present invention will not decouple the cooking appliance from its energy source.

What is claimed is:

1. A system for automatically shutting off appliances consisting of:
   a sensor for sensing a predetermined environmental condition;
   a transmitter in communication with said sensor, said transmitter sending a signal in response to said sensor sensing said predetermined environmental condition;
   a receiver, located remotely from said transmitter, capable of detecting said signal and activating, in response to receipt of said signal;
   a timer for counting down a pre-set time interval, said timer consisting of an electronic semiconductor timing circuit and an electronic switching device;

a timer alarm operatively coupled to said timer for indicating when said timer has begun counting down said pre-set time interval;

a deactivating device connected in series with a power supply of an appliance for deactivating said appliance by decoupling said appliance from said power supply in response to expiration of said pre-set time interval;

an override mechanism for stopping said timer counting down said pre-set time interval;

a second timer to begin counting down a second pre-set time interval when said override mechanism is triggered, said override mechanism to return to a non-override position upon expiration of said second pre-set time interval, thereby causing said first timer to again countdown said pre-set time interval.

2. The system of claim 1 wherein said power supply for said appliance is a source of natural gas and said deactivating device for deactivating said appliance consists of a two-stage in-line gas valve and an electrical circuit operatively associated with said two-stage in-line gas valve.

3. The system of claim 1 further consisting of: a hook and loop attachment for attaching said sensor and said transmitter to a flat surface.

4. The system of claim 1 wherein said power supply for said appliance is a source of electricity said electricity consisting of an alternating current, and said deactivating device consists of an electrical decoupler operatively associated with a pair of input terminals similar to standard electrical male prongs adapted for releasable engagement with said source of electricity and a pair of output terminals similar to standard electrical female receptacles, adapted for releasable engagement with a power cord of said appliance.

5. The system of claim 1 wherein said predetermined environmental condition is a presence of carbon monoxide.

6. The system of claim 1 wherein said receiver, said timer, said timer alarm, said second timer, said deactivating device, and said override mechanism, are combined into a single unit contained within a box measuring less than one cubic meter of volume.

7. The system of claim 6 wherein said single box weighs less than five pounds.

* * * * *